United States Patent
Gray

(10) Patent No.: US 8,864,075 B2
(45) Date of Patent: Oct. 21, 2014

(54) ELONGATE COMPOSITE STRUCTURAL MEMBERS AND IMPROVEMENTS THEREIN

(75) Inventor: Ian L. Gray, Bristol (GB)

(73) Assignee: Airbus Operations Limited, Bristol (GB)

(*) Notice: Subject to any disclaimer, the term of this patent is extended or adjusted under 35 U.S.C. 154(b) by 1204 days.

(21) Appl. No.: 12/602,160

(22) PCT Filed: Jun. 24, 2008

(86) PCT No.: PCT/GB2008/050481
§ 371 (c)(1),
(2), (4) Date: Nov. 30, 2009

(87) PCT Pub. No.: WO2009/004363
PCT Pub. Date: Jan. 8, 2009

(65) Prior Publication Data
US 2010/0170989 A1 Jul. 8, 2010

(30) Foreign Application Priority Data
Jun. 29, 2007 (GB) .................... 0712552.9

(51) Int. Cl.
*B64C 3/18* (2006.01)
*B64C 1/06* (2006.01)
*G06F 17/50* (2006.01)
*B29C 70/30* (2006.01)
*B29K 105/24* (2006.01)
*B64C 1/00* (2006.01)

(52) U.S. Cl.
CPC .............. *B64C 1/064* (2013.01); *B64C 3/185* (2013.01); *Y02T 50/433* (2013.01); *G06F 17/5095* (2013.01); *Y02T 50/43* (2013.01); *B29K 2105/246* (2013.01); *B64C 3/182* (2013.01); *B64C 1/065* (2013.01); *B29C 70/30* (2013.01); *B64C 3/187* (2013.01); *B64C 2001/0072* (2013.01)
USPC ................... 244/123.1; 244/123.8; 244/119

(58) Field of Classification Search
USPC ......... 244/123.1, 123.12, 123.14, 123.8, 124, 244/119, 120
See application file for complete search history.

(56) References Cited

U.S. PATENT DOCUMENTS 2,471,490 A 5/1949 Mercer
2,655,194 A 10/1953 Nilsson
(Continued)

FOREIGN PATENT DOCUMENTS

DE 1452724 3/1969
DE 1452724 A1 5/1969
(Continued)

OTHER PUBLICATIONS

Russian OA—Decision on Granting with English translation dated Jun. 18, 2013.
(Continued)

*Primary Examiner* — Tien Dinh
*Assistant Examiner* — Steven Hawk
(74) *Attorney, Agent, or Firm* — Lowe Hauptman & Ham, LLP

(57) ABSTRACT

A composite material elongate structural member, such as a spar, for use in an aerospace structure, comprises a web disposed between upper and lower flanges. The web may include a clockwise twist about an axis parallel to the length L at a first portion towards the wing-root-end of the spar and a counter-twist in the anticlockwise direction at a second portion towards the wing-tip-end of the spar. The geometry of the spar may vary non-linearly along its length (L) so that the developed width of the spar as measured from a distal edge of the upper flange via the web to a distal edge of the lower flange varies linearly with increasing distance along the length (L). The risk of causing, during fabrication of the spar, undesirable creasing, stressing or stretching of composite material layers in a region in which the geometry of the member varies non-linearly may be reduced by means of such an arrangement.

15 Claims, 10 Drawing Sheets

(56) References Cited

U.S. PATENT DOCUMENTS

| | | | |
|---|---|---|---|
| 3,355,922 A | 12/1967 | Utashiro et al. | |
| 3,519,228 A * | 7/1970 | Windecker | 244/123.5 |
| 3,657,911 A | 4/1972 | Clarke et al. | |
| 3,838,590 A | 10/1974 | Van Dijk | |
| 4,006,617 A * | 2/1977 | Foster | 72/10.1 |
| 4,084,029 A * | 4/1978 | Johnson et al. | 428/119 |
| 4,331,723 A * | 5/1982 | Hamm | 428/61 |
| 4,913,910 A | 4/1990 | McCarville et al. | |
| 5,026,447 A * | 6/1991 | O'Connor | 156/166 |
| 5,036,688 A | 8/1991 | Gillean | |
| 5,074,139 A | 12/1991 | Elliott | |
| 5,096,525 A | 3/1992 | Engwall | |
| 5,171,510 A | 12/1992 | Barquet et al. | |
| 5,182,060 A | 1/1993 | Berecz | |
| 5,476,704 A * | 12/1995 | Kohler | 428/119 |
| 5,538,589 A | 7/1996 | Jensen et al. | |
| 5,729,462 A | 3/1998 | Newkirk et al. | |
| 5,820,804 A | 10/1998 | Elmaleh | |
| 5,848,765 A * | 12/1998 | Gillespie | 244/124 |
| 5,984,511 A * | 11/1999 | Vasey-Glandon et al. | 703/6 |
| 6,114,012 A * | 9/2000 | Amaoka et al. | 428/182 |
| 6,355,133 B1 | 3/2002 | Williams | |
| 6,375,120 B1 * | 4/2002 | Wolnek | 244/123.8 |
| 6,478,922 B1 * | 11/2002 | Rosevear et al. | 156/297 |
| 6,513,757 B1 * | 2/2003 | Amaoka et al. | 244/123.7 |
| 6,569,371 B1 | 5/2003 | Asari et al. | |
| 6,701,990 B1 | 3/2004 | Burley et al. | |
| 6,783,718 B2 | 8/2004 | Blanchon et al. | |
| 6,814,916 B2 | 11/2004 | Willden et al. | |
| 6,890,470 B2 | 5/2005 | Staub et al. | |
| 7,141,199 B2 | 11/2006 | Sana et al. | |
| 7,195,203 B2 | 3/2007 | Livingstone et al. | |
| 7,469,735 B2 | 12/2008 | Brown et al. | |
| 7,682,682 B2 * | 3/2010 | Leon-Dufour et al. | 428/119 |
| 8,104,714 B2 * | 1/2012 | Brown et al. | 244/123.8 |
| 8,276,848 B2 * | 10/2012 | Zuniga Sagredo | 244/123.8 |
| 2005/0116105 A1 * | 6/2005 | Munk et al. | 244/123 |
| 2007/0175573 A1 | 8/2007 | Fox et al. | |

FOREIGN PATENT DOCUMENTS

| | | |
|---|---|---|
| EP | 0395224 A2 | 10/1990 |
| EP | 1070661 A2 | 1/2001 |
| EP | 1134070 | 9/2001 |
| EP | 1134070 A1 | 9/2001 |
| EP | 1408224 | 4/2004 |
| EP | 1547756 A1 | 6/2005 |
| EP | 1555204 A1 | 7/2005 |
| EP | 1566334 | 8/2005 |
| GB | 2312532 A | 10/1997 |
| JP | 59027722 | 2/1984 |
| JP | 59179228 | 10/1984 |
| JP | 61108404 A | 5/1986 |
| JP | 62207637 A | 9/1987 |
| JP | 04299110 A | 10/1992 |
| JP | 05042590 A | 2/1993 |
| JP | 6226356 | 8/1994 |
| JP | 7089353 | 4/1995 |
| JP | 08025386 A | 1/1996 |
| JP | 08085159 A | 4/1996 |
| JP | 10137853 A | 5/1998 |
| JP | 2003053851 A | 2/2003 |
| JP | 2004351882 A | 12/2004 |
| RU | 2144487 C1 | 1/2000 |
| RU | 2219058 C1 | 12/2003 |
| SU | 1304743 A3 | 4/1987 |
| WO | 0024563 | 5/2000 |
| WO | 0037244 | 6/2000 |
| WO | 0196094 A2 | 12/2001 |
| WO | 0222440 A1 | 3/2002 |
| WO | 03082670 A1 | 10/2003 |
| WO | 2005/105413 A2 | 11/2005 |
| WO | 2005105413 | 11/2005 |
| WO | 2005105413 A2 | 11/2005 |
| WO | 2009004362 | 1/2009 |
| WO | 2009004364 | 1/2009 |

OTHER PUBLICATIONS

UK Search Report for GB0712553.7 dated Sep. 15, 2007.
ISR and WO for PCT/GB2008/050480 dated Apr. 22, 2009.
UK Search Report for GB0712552.9 dated Sep. 15, 2007.
ISR and WO for PCT/GB2008/050481 dated Mar. 30, 2009.
UK Search Report for GB0712549.5 dated Sep. 15, 2007.
ISR and WO for PCT/GB2008/050485 dated Mar. 31, 2009.

* cited by examiner

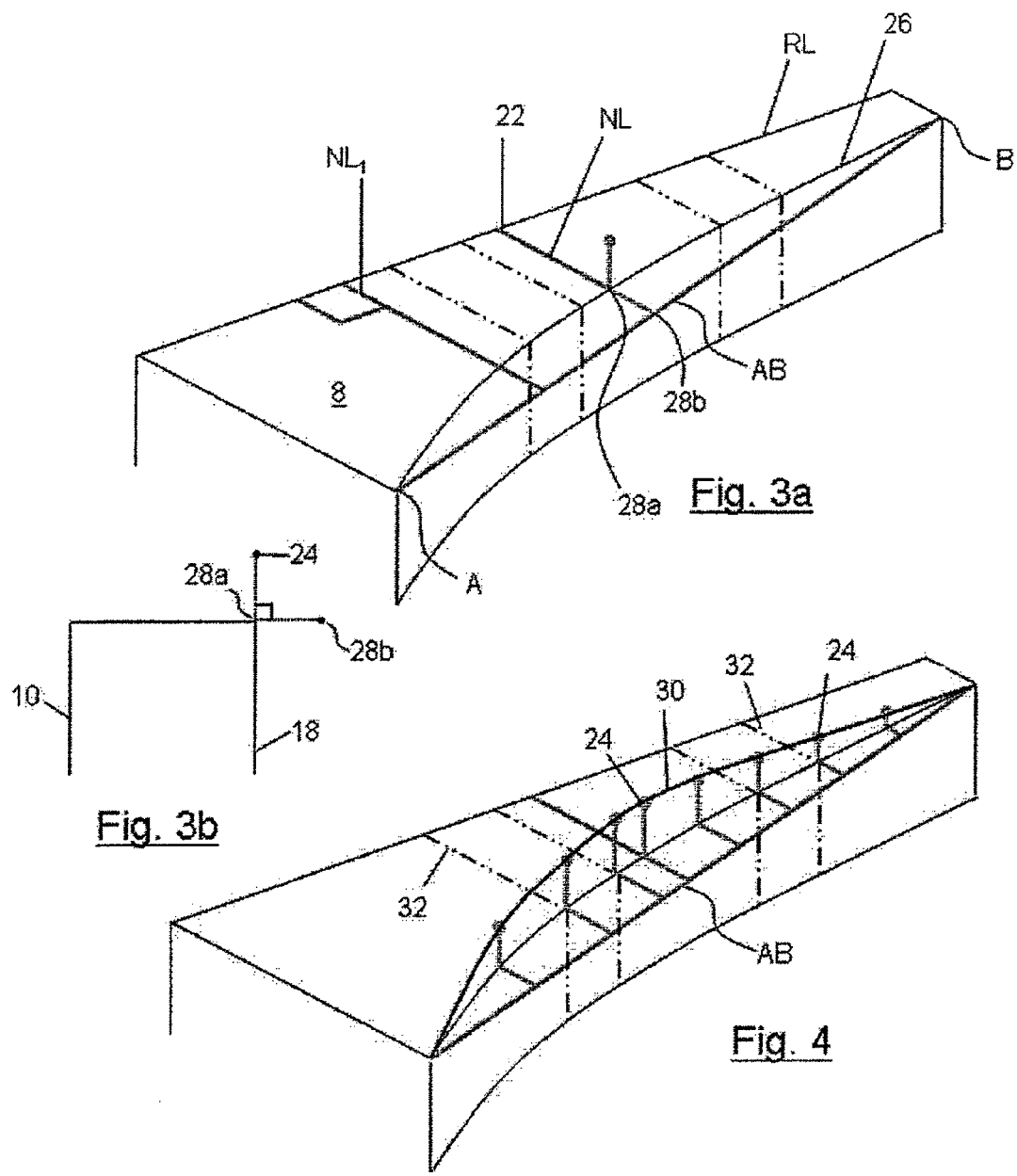

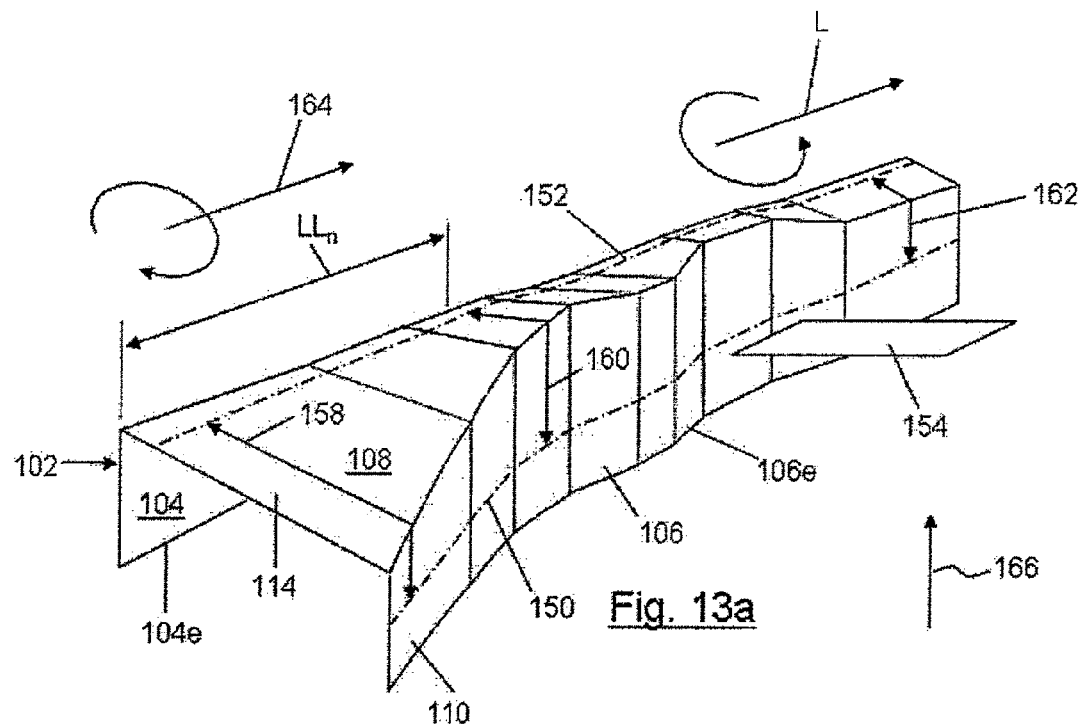
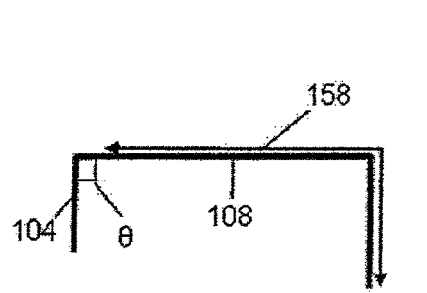
Fig. 13b
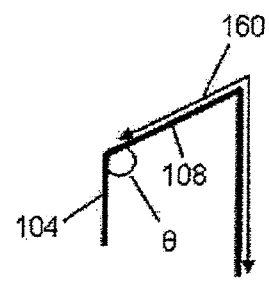
Fig. 13c
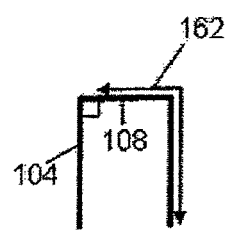
Fig. 13d

ELONGATE COMPOSITE STRUCTURAL MEMBERS AND IMPROVEMENTS THEREIN

RELATED APPLICATIONS

The present application is a National Phase of PCT/GB08/050,481 filed Jun. 24, 2008, and claims priority from British Application Number 0712552.9 filed Jun. 29, 2007, the disclosures of which are hereby incorporated by reference herein in their entirety.

This application is related to concurrently filed applications titled COMPOSITE PANEL STIFFENER National Phase of PCT/GB08/050,480) and IMPROVEMENTS IN ELONGATE COMPOSITE STRUCTURAL MEMBERS National Phase of PCT/GB08/050,485). The related applications are incorporated by reference herein in their entirety.

TECHNICAL FIELD

The present invention concerns composite material structures for use in aerospace applications. More particularly, but not exclusively, this invention concerns an elongate composite structural member, for example in the form of a composite spar, a composite rib, a composite stringer, or the like. The invention also concerns a method of designing and a method of manufacturing such an elongate composite structural member, for example with the use of a suitably programmed computer.

BACKGROUND OF THE INVENTION

Elongate composite structural members, such as spars, ribs, stringers and the like are typically used to provide structural support in a structure on a global or local scale. Spars and ribs for example provide the main structural framework for an aerofoil box or fuselage structure. Stringers for example are used as stiffening members.

Elongate composite structural members thus have portions that are adapted to abut another component, for example to stiffen, strengthen and/or to support such another component. The component against which the elongate composite structural abuts may for example be in the form of a panel or section of skin that defines a surface of an aircraft.

Such elongate composite structural members may have a cross-section in the form of a U-shape, in the form of a T-shape, in the form of an L-shape or other suitable shapes. Typically, the structural member will have a foot which has a shape adapted to abut the surface of the structure/component to be stiffened/supported and a web that projects from the foot and away from the surface of the structure/component to be stiffened/supported, the web increasing the stiffness/strength of the structural member. The web is sometimes referred to as the blade of the structural member.

The thickness or geometry of the surface of the structure/component to be stiffened/supported may vary, thereby producing local features in the face of the structure/component adjacent to the structural member. Thus, corresponding variations in the geometry of the structural member may be necessary. Local variations in the geometry of the structural member can however introduce manufacturing problems when fabricating composite structural members. For example, in order to increase the local strength or stiffness of an aircraft wing panel, it is common practice to vary the thickness of the panel locally where extra stiffness or strength is required. This results in pad-ups in the panel when viewed from the interior of the wing-box. Thus, the thickness of the panel, may, with increasing direction along the length of an associated spar or stringer, ramp up to a locally thicker section and then ramp down to a thinner section. To accommodate the change in thickness in the panel, the foot of the associated spar/stringer needs to correspondingly ramp up and ramp down. The shape of the spar/stringer may therefore include local variations in its cross-sectional geometry, as a function of distance along its length.

The desired shape of structural member for use when stiffening a panel may therefore be complicated and may deviate from a linearly symmetrical geometry. Manufacturing composite structural members having a complicated geometry can be difficult. If local changes in cross-sectional geometry of the structural member are required, defects may be introduced during the fabrication process. Such defects usually result from layers of fibre material being compressed or folded in regions where there is too much material in view of the local geometry. This can produce creases in the final product, typically in the form of transverse creases. Defects can also result from layers of fibre material being stretched and/or stressed in regions where there is too little material in view of the local geometry. This too can produce creases in the final product, typically in the form of longitudinal creases. Either of the foregoing types of defect (too little material or too much material) can result in undesirable weakening of, and/or localised internal stresses in, the composite material in such regions. Such defects are typically allowed for and suitable margins built in by adding extra material in such regions, to counteract the strength-reducing defects. Whilst the strength of the resulting component may not be thus compromised, this technique introduces a weight penalty and excessive structural volume.

The present invention seeks to mitigate one or more of the above-mentioned problems. Alternatively or additionally, the present invention seeks to provide an improved shape of elongate composite structural member and/or an improved method of designing and/or manufacturing the same.

SUMMARY OF THE INVENTION

In accordance with a first aspect of the present invention there is provided an elongate structural member for use in an aerospace structure, wherein
the structural member is made from composite material comprising a multiplicity of layers,
the structural member has a foot and a web extending from the foot,
the structural member defines
a first surface on the foot being shaped to abut a structure,
a second surface on the foot being opposite the first surface,
a third surface on or in the web being at the same layer in the composite material as the first surface, and a
a fourth surface on the web being on the same side of the structural member as the second surface,
the cross-sectional geometry of the structural member varies along at least part of its length so that the geodesic distance between first and second notional reference lines increases substantially linearly as a function of lengthwise distance along said at least part of the length of the structural member, the first and second notional reference lines each being geodesic lines, which extend across the entire length of said at least part of the length of the structural member, the first notional line lying on the first surface and the second notional line lying on the third surface, and the geodesic distance being measured along the first and third surfaces of the structural member.

Thus, an elongate structural member according to an example of the first aspect of the invention may have a shape that has a developed transverse width that varies linearly as a function of distance along its length. The developed transverse width in the context of this example is the geodesic distance along the first and third surfaces from a point at a far end of the foot of the structural member to a point at the far end of the web of the structural member. Having such a linearly varying developed width allows the layers of the composite material that form the structural member to be laid up during manufacture of the structural member in a manner that reduces the risk of local creasing and/or local stretching. This is because the fibres of the material need not be bunched together or stretched apart when being manipulated from a state in which the fibres form flat (planar) plies of material to the non-planar geometry of the mould used to form the structural member during fabrication. The cross-sectional geometry preferably changes in a non-linear manner as a function of distance along the length of the member. For example the height of the web, when viewed in transverse cross-section may vary non-linearly with length along the structural member.

Designing a structural member to have a linearly varying developed width can be effected by means of matching a displacement in the position of the foot with a displacement in the position of the web. Such a technique is briefly described below with reference to the drawings and is also described and claimed in the Applicant's copending UK patent application entitled "Composite Panel Stiffener", which corresponds to U.S. application Ser. No. 12/602,158, having the same filing date as the present application. The contents of that application are fully incorporated herein by reference. The claims of the present application may incorporate any of the features disclosed in that patent application. In particular, the claims of the present application may be amended to include features relating to the geometry of the structural member varying along at least part of its length so that with increasing distance in a given direction along the length of the structural member the first surface is displaced towards the second surface as the fourth surface is displaced towards the third surface. The structural member of the present invention (which may be in the form of a spar, rib, stringer, or other elongate structure) may also be defined with reference to features of the stringer described or claimed in the above-mentioned related patent application.

Alternatively, or additionally, designing a structural member to have a linearly varying developed width can be effected by means of introducing a chamfer/curved portion between the web and the foot that changes in size, for example as the foot is displaced up and/or down along the length of the structural member. Such a technique is briefly described below with reference to the drawings and is also described and claimed in the Applicant's copending UK patent application entitled "Improvements in Elongate Composite Structural Members", which corresponds to U.S. application Ser. No. 12/602,163, having the same filing date as the present application. The contents of that application are fully incorporated herein by reference. The claims of the present application may incorporate any of the features disclosed in that patent application. In particular, the claims of the present application may be amended to include features relating to there being a shape, such as a chamfer/curved portion, between the web and the foot of a structural member that changes in size as the foot is displaced up and/or down along the length of the structural member. The structural member of the present invention may also be defined with reference to features of the structural member described or claimed in the above-mentioned related patent application.

Alternatively, or additionally, designing a structural member to have a linearly varying developed width can be effected by means of varying the angle at which the web extends from the foot as a function of the distance along the length of the structural member. In certain embodiments of the invention, the geometry of the structural member changes with increasing distance in a given direction along its length such that the third surface twists about an axis being generally aligned with the length of the structural member. The twisting of the third surface may be such that it is predominantly in one direction for a first portion along the length of the structural member and predominantly in the opposite direction for a second portion along the length of the structural member.

The twisting of the third surface may be effected substantially step-wise, for example such that the third surface includes adjacent sections of surfaces of different gradients, there being a large rate of change of gradient at the boundary between adjacent sections. The twisting of the third surface may include one or more regions that progressively twist (in a monotonic fashion) with increasing distance along the length of the member.

Certain embodiments of the present invention may have such a twisting third surface, but which do not have a geometry in accordance with the first aspect of the present invention. Thus, in accordance with a second aspect of the present invention there is provided an elongate structural member for use in an aerospace structure, wherein the structural member is made from composite material comprising a multiplicity of layers, the structural member has a foot and a web extending from the foot, the structural member defines a first surface on the foot being shaped to abut a structure, a second surface on the foot being opposite the first surface, a third surface on or in the web being at the same layer in the composite material as the first surface, and a a fourth surface on the web being on the same side of the structural member as the second surface, the cross-sectional geometry of the structural member varies along at least part of its length so that with increasing distance in a given direction along the length of the structural member the third surface twists about an axis being generally aligned with the length of the structural member, the twisting of the third surface being predominantly in one direction for a first portion along the length of the structural member and being predominantly in the opposite direction for a second portion along the length of the structural member.

Whilst a structural member in accordance with embodiments of the second aspect of the invention need not have a shape which has a developed width which varies linearly with increasing distance along the length of the member, the deviation from such a linearly varying relationship may be reduced by means of the twisting to such an extent as to give benefits when fabricating the composite structural member. For example, the feature of the web including such a twist and a counter-twist may allow the layers of the composite material that form the structural member to be laid up during fabrication of the structural member in a manner that reduces the risk of local creasing, local stressing and/or local stretching.

The first portion may be longer than a quarter of the length of the structural member. The second portion may be longer than a quarter of the length of the structural member. In an embodiment of the invention, related to this second aspect of the invention, there is provided a composite spar for an aircraft wing, wherein the spar has a length and a width, the spar has upper and lower flanges joined by a web, a single layer of composite material extends, between a pair of opposite edges of the layer, from the upper flange via the web to the lower flange, the cross-sectional geometry of the spar varies with distance along the length of the spar in the region of the single layer, and the widthwise geodesic distance as measured along the single layer between the pair of opposite edges increases substantially linearly as a function of distance along the length of the layer.

The elongate structural member may have a cross-sectional geometry that, despite varying with length, has generally the same type of shape. The cross-sectional shape may be H-shaped, for example having two feet and a web that extends between the feet, the web projecting from or near the centre line of each foot. The cross-sectional shape may be U-shaped, for example having two feet and a web that extends between the feet, the web projecting from or near the edge of each foot. The cross-sectional shape may be Y-shaped, for example having two feet for abutting the same surface and a web that extends from the two feet, the web being in the form of a blade having an exposed end opposite the end that joins the two feet. The cross-sectional shape may be L-shaped, for example having one foot and a web that extends from an edge of the foot, the web being in the form of a blade having an exposed end opposite the end that joins the foot.

It will be appreciated that the invention as defined above relates to the structural member itself and does not necessarily include the structure (for example a component, such as a wing panel) against which the structural member is adapted to abut.

The elongate structural member of the present invention may form part of a structure on an aircraft. There may for example be provided a structural member, in the form of a spar for example, and another component/structure, for example in the form of a wing panel of an aircraft, wherein the structural member is mounted on the component/structure.

The invention provides an aerospace structure (such as for example a fuselage, an aerofoil box, or a section thereof), an outer surface of which being defined by a skin, wherein an inner surface of the skin abuts a foot of an elongate structural member being in accordance with a structural member according to any aspect of the invention described or claimed herein. For example, the skin may be supported from inside the structure by means of a structural member, for example a spar, on which the skin is mounted, the structural member (the spar) being in accordance with the present invention.

The invention also provides an aircraft, an outer surface of which being defined by a skin, wherein an inner surface of the skin abuts a foot of an elongate structural member being in accordance with any aspect of the invention described or claimed herein.

The invention yet further provides a method of making a design model for an elongate composite structural member, wherein the structural member is a structural member according to any aspect of the invention described or claimed herein.

There is also provided a method of making a design model for an aircraft wing spar having upper and lower flanges joined by a web, wherein the method comprises the steps of:

providing first data representing desired geometry of at least parts of both the upper and lower flanges of a spar to be made, the separation between the flanges varying as a non-linear function of the distance along the length of the spar and varying such that the separation between the flanges at a root end of the spar is greater than the separation between the flanges at a tip end of the spar, generating second data defining the shape of a web and upper and lower flanges of a spar model including generating changes in the geometry of the spar model at regions where it is ascertained from the first data that there are deviations from a linear relationship between (i) the distance along the length of the spar model and (ii) a distance parameter that changes in dependence on the separation between the upper and lower flanges, and using said first data and said second data to output a structural member model including a foot and a web. Some aspects of the geometry of the spar may be left unspecified by the first data. The first data may include data concerning the loads to be sustained by the spar and/or data concerning the geometry of the upper and/or lower flanges such as for example, the shape of the wing panel against which the flanges abut. The distance parameter may be a measure of the geodesic distance between distal edges of the upper and lower flanges. The distance parameter may be a measure of the developed width of the spar. The distance parameter may be the geodesic distance between first and second geodesic lines being so positioned that either (a) one line is on one of the upper and lower flanges and the other line is on the web or (b) one line is on one of the upper and lower flanges and the other line is on the other of the upper and lower flanges. At least one of the geodesic lines may for example lie on an exterior surface on the flange of the spar model. At least one of the geodesic lines may for example lie on a surface on/in the web of the spar model. It will however be appreciated that it is preferred that the first and second geodesic lines lie on surfaces being at the same level in the model as each other so that the geodesic distance is simply measured within the confines of that level (the level corresponding to, or being parallel with, a single ply of fibre material of a composite spar manufactured in accordance with the model).

The first data may form at least part of a collection of data that defines a model of the ribs or wing skin against which the spar is to be adapted to abut. The desired shape of at least one of the flanges of the spar model may therefore be derived indirectly from such a collection of data.

In embodiments of the present invention, the changes in the geometry of the spar model are advantageously generated to reduce the risk of defects being created in a spar made from layered composite material according to the spar model. For example, the shape of the spar may include a web which is oriented relative to a flange such that the angle between the web and flange varies as a function of distance along the length of the spar. The shape of the spar may be designed to reduce any deviation from a linear relationship between the distance along the length of the spar model and the distance parameter.

The design method is preferably performed electronically, for example with the use of a suitably programmed computer. Once the spar model is generated, a spar may be manufactured in accordance with the model so generated. The design of the spar model may be performed in one country, with electronic data representing the spar model being exported to a different country for use in such a method of manufacture.

The present invention also provides a method of manufacturing a spar, wherein the method comprises the steps of:

providing a mould tool having a profile dependent on a spar model generated by means of a design method in accordance with any aspect of the invention described or claimed herein, laying up layers of composite material on the mould tool, and then curing the layers of composite material.

It will of course be appreciated that features described in relation to one aspect of the present invention may be incorporated into other aspects of the present invention. For example, the method of the invention may incorporate any of the features described with reference to the structural member of the invention and vice versa.

BRIEF DESCRIPTION OF THE DRAWINGS

Embodiments of the present invention will now be described, by way of example only, with reference to the accompanying schematic drawings, of which:

FIG. 3a to 11b illustrate how the model shown in FIG. 2 is manipulated electronically to arrive at the design model defining the shape of the spar of FIG. 1;

FIGS. 13a to 13d illustrates a model of a spar in accordance with a third embodiment of the present invention.

DETAILED DESCRIPTION

Figure 1:
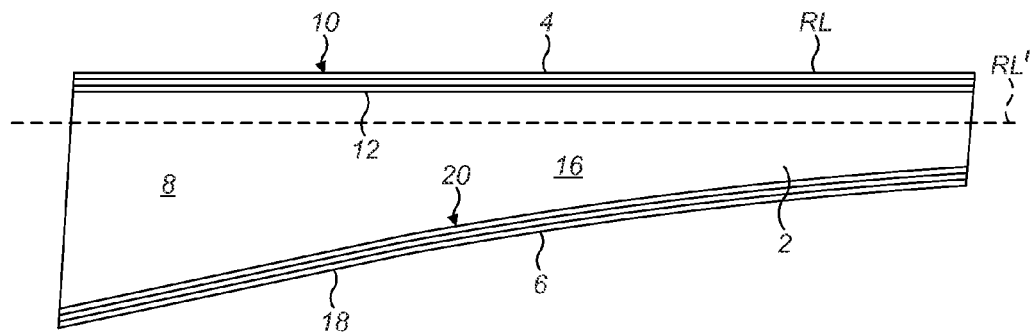
FIG. 1 is a side view of a spar designed in accordance with a first embodiment of the invention.

FIG. 1 shows a structural member, in this embodiment in the form of a spar 2, for use in an aerospace structure, in this embodiment in the form of a wing. The spar 2 is made from composite material comprising a multiplicity of layers. The spar 2 has two flanges 4, 6 which follow the upper and lower surfaces of the wing. Thus, the spar 2 has an upper flange 4 connected to a lower flange 6 by means of a web 8. The upper flange 4 (which may be considered as forming a foot of the spar) has a first surface 10 shaped to abut the inner surface of the upper wing skin (not shown). Opposite the first surface 10 of the upper flange 4 is a second surface 12. The first surface 10 on the upper flange 4 meets with a third surface 14 on the web 8, the first and third surfaces being on the same side of the spar 2 and therefore also being at the same layer in the composite material structure as each other. There is a fourth surface 16 opposite the third surface 14. The fourth surface 16 is therefore on the web 8, on the same side of the spar 2 as the second surface 12 and also at the same layer in the composite material structure as the second surface 12. In a similar manner to the upper flange 4, the lower flange 6 (which may be considered as forming another foot of the spar) includes a fifth surface 18 being shaped to abut the inner surface of the lower wing skin (not shown), the fifth surface 18 being on the same side of the spar 2 and therefore also being at the same layer in the composite material structure as the first and third surfaces 10, 14. There is also a sixth surface 20, on the lower flange 6 which is on the same side of the spar 2 as the second and fourth surfaces 12, 16, and therefore also at the same layer in the composite material structure as those surfaces. It will be appreciated that during manufacture of the composite spar, for example by means of a hot drape forming process, the outer mould line (OML) surface is defined by the first, third and fifth surfaces, whereas the inner mould line (IML) is defined by the second, fourth and sixth surfaces.

The geometry of the spar 2 is shown in FIG. 1 is designed in accordance with a method illustrated by FIGS. 2 to 11b. The method of the first embodiment of the invention generates a geometry of spar such that:

(1) the first surface 10 on the upper flange 4 has a geometry that matches and corresponds to the desired geometry of the wing skin at the interface between the spar and the upper wing skin;

(2) the fifth surface 18 on the lower flange 6 has a geometry that matches and corresponds to the desired geometry of the wing skin at the interface between the spar and the lower wing skin; and (3) the geometry of the first, third and fifth surfaces of the spar is such that its developed form is effectively a two-dimensional plane.

By ensuring that the developed form of the component is a 2-D plane, it enables the layers of fibre mats that are laid up during the hot drape forming process to be folded and manipulated to adapt to the desired geometry of the spar as defined by the inner and outer mould surfaces without bunching fibres together; stretching the fabric or creating undesirable creases or internal stresses.

There now follows a description of the method of design used to produce a spar 2 in accordance with the first embodiment.

Figure 2:
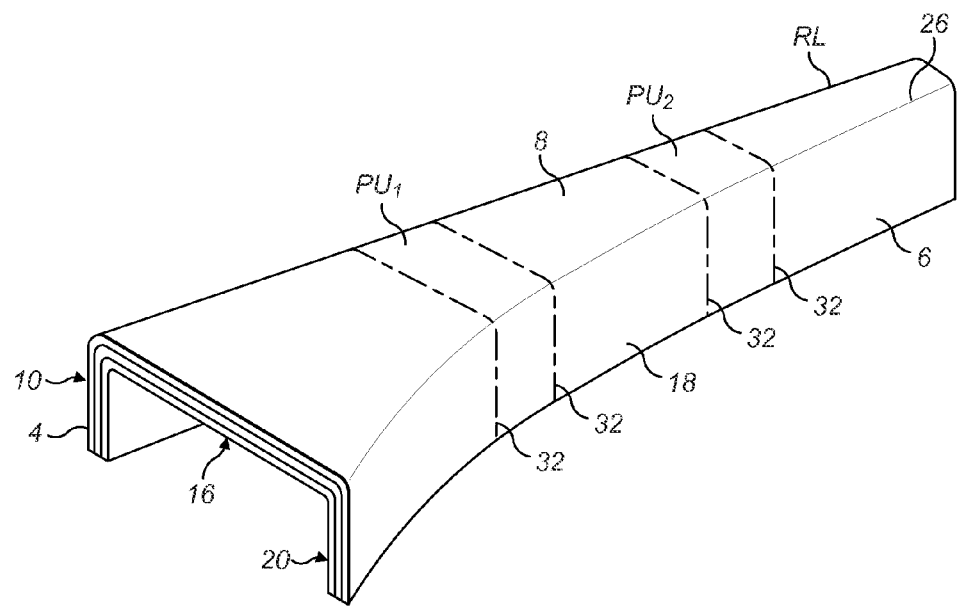
FIG. 2 is a model of the general desired shape of a spar used in a method of spar design forming part of the first embodiment of the invention.

FIG. 2 shows a model of a spar incorporating the general overall desired geometry of the spar. Thus the first and fifth surfaces 10, 18 define the general curvature of the wing (in this case so that the shape is of a kind having a lower surface with decreasing radius of curvature with increasing distance from the tip of the wing—typically known as a gull-wing shape), but without incorporating any required local changes in geometry. The model shown in FIG. 2 has a web surface 8 which is planer. The first and fifth surfaces 10, 18 meet the web 8 at an angle of 90 degrees, there being no fillet/corner radii between the web and flanges. A notional base reference line RL is defined, in this case the reference line being coincident with the upper flange heel line of the model shown in FIG. 2. (It should be noted that the reference line RL is chosen in dependence on the particular component geometry and is independent of the fibre axis of the composite material that will eventually form the spar when manufactured.) Whilst in this embodiment the reference line is coincident with the upper flange heel line it could equally be defined by any other line to which all subsequent geometrical manipulations made depend on or refer to, such as the reference line RL'—also shown in FIG. 1, which is spaced apart from but parallel to the heel line RL.

FIG. 2 also shows two regions $PU_1$ and $PU_2$ where pad-up/thickness changes are required in order to match the wing skin geometry (the regions in FIG. 2 being defined by the two pairs of dashed lines 32). As shown in FIG. 3a, a second reference line AB is defined as the straight line that joins the points A, B at the extreme ends of the junction between the lower flange 6 and the web 8. A spline line 30 is then generated by joining a multiplicity of offset points 24 which are generated in a manner as described below.

With reference to the FIGS. 3a and 3b, a point 22 is selected along the length of the reference line RL and a normal line NL is inserted so that the line NL extends from the selected point 22 in a direction normal to the reference line RL and within the plane of the web 8 (a line parallel to the nominal line $NL_1$ shown in FIG. 3a.) An offset point 24 is then inserted at a point separated from the lower flange edge 26 in a direction normal to the web 8, by a distance equal to the separation between (a) the point 28a at which the lower flange edge intercepts the normal line NL and (b) the point 28b at which the line AB intercepts the normal line NL.

As can be seen from FIG. 4 the step of generating offset points 24 is repeated a multiplicity of times, sufficient to ensure that a smooth spline 30 can be inserted which joins all such offset points 24. Offset points are specifically generated at the boundaries 32 of the pad-up/thickness changes and at any maxima and minima of thickness/geometry changes.

By creating the spline line 30 in this way (with linear offsets based on the separation of the lower flange edge 26 from a notional straight reference line AB, the developed width of the spar is caused to be closer to a developed width, which changes linearly as a function of distance along the length of the spar.

Figure 5A:
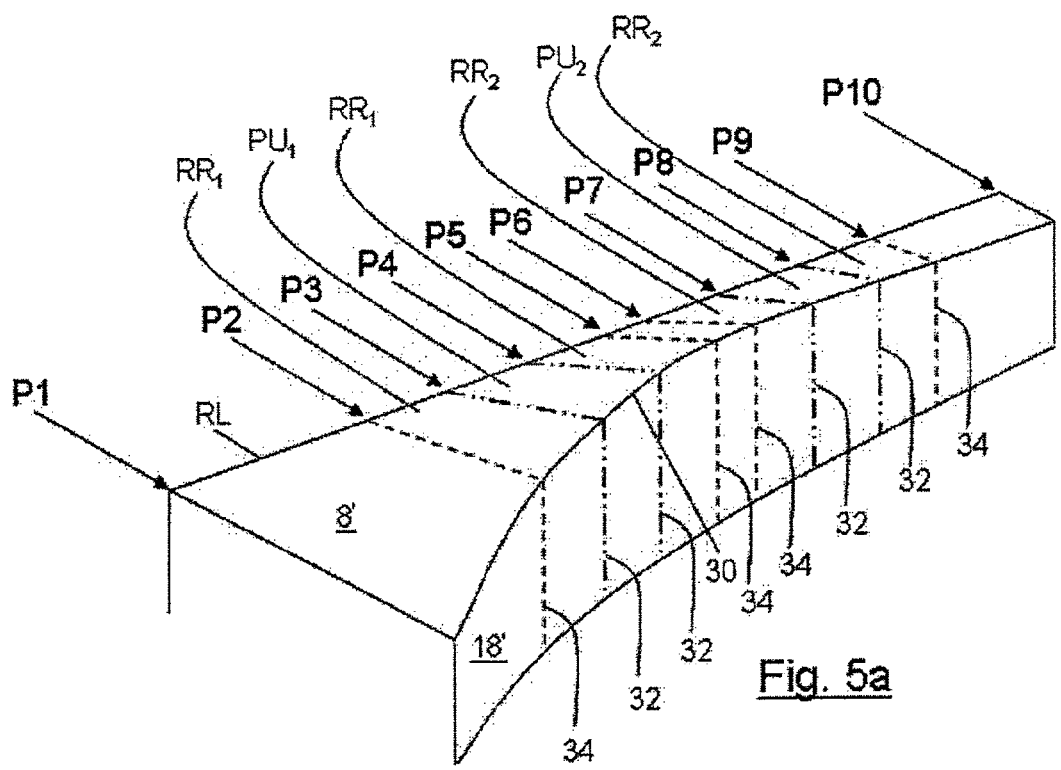

With reference to FIG. 5a two new surfaces 8' and 18' are generated, the new surfaces meeting at the spline line 30. The boundaries 32 of the pad-up/thickness changes are mapped onto the new surfaces 8', 18' by projecting the boundaries 32 upwards (i.e. normal to the original planar web surface 8). Ramp boundaries 34 are also inserted at appropriate positions to enable the change in thickness of the pad-up regions $PU_1$, $PU_2$ to be reached gradually via ramping regions $R_1$ and $R_2$.

Figure 5B:
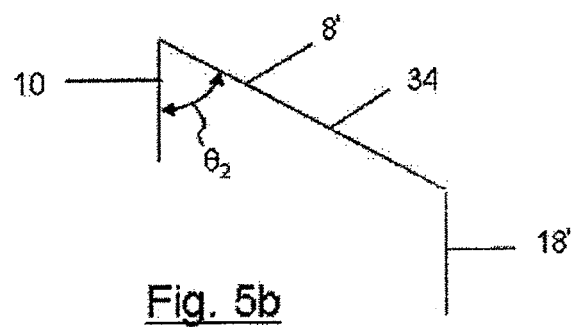

FIG. 5a shows ten positions P1 to P10 along the length of the reference line RL. Positions P1 and P10 are located at the extreme ends of the reference line RL. Positions P2, P5, P6 and P9 are defined by the starts and ends of the ramping regions $R_1$ and $R_2$. Positions P3, P4, P7 and P8 are defined by the pad-up regions $PU_1$ and $PU_2$. At each position P1 to P10 along the reference line RL, the angle θ between the upper flange line and the revised web line 8', as measured within a cross-section taken about a plane having its normal parallel to the reference line RL, is determined. FIG. 5b shows schematically the angle $θ_2$ measured at position P2 by way of example. Whilst FIGS. 5a and 5b imply that only ten such angles would be measured it will be appreciated that intermediate positions may be measured if deemed appropriate in order to ensure accurate interpolation of the measurements made.

Figure 6:
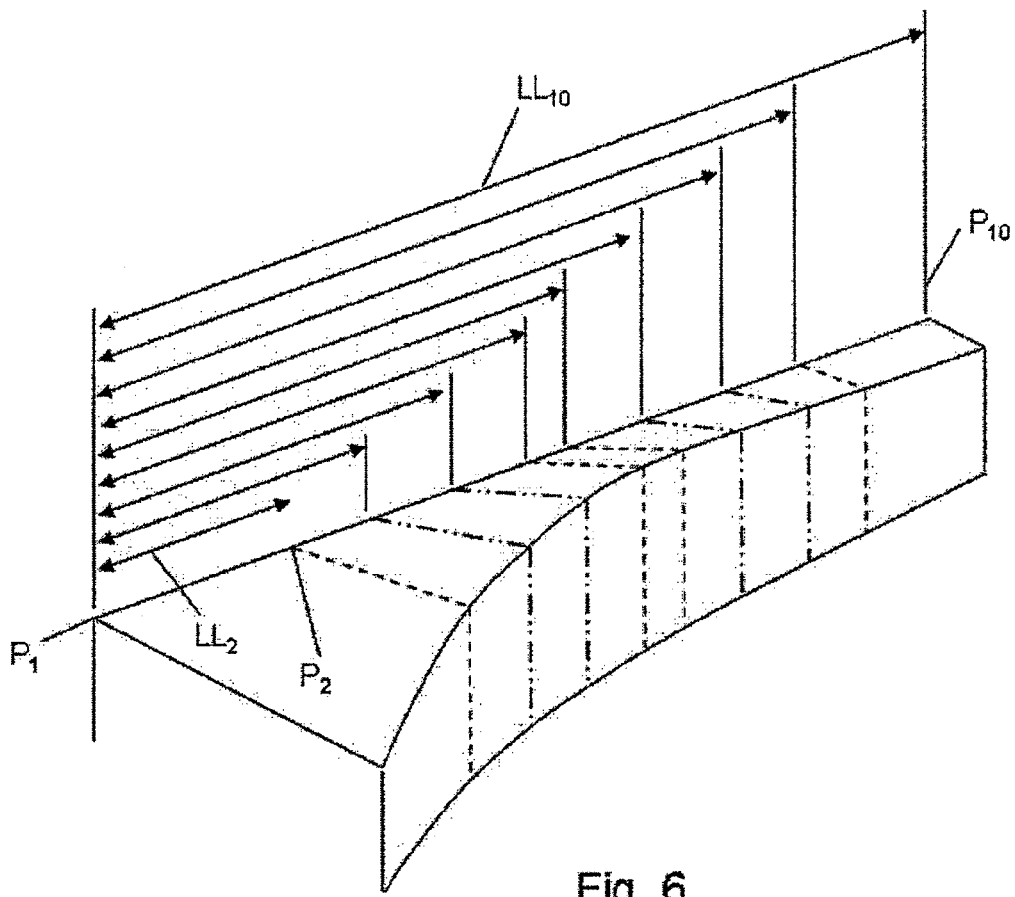

Then, with reference to FIG. 6 the linear lengths, $LL_2$ to $LL_{10}$, from the reference position P1 to each of the other positions P2 to P10 is measured.

Figure 7A:
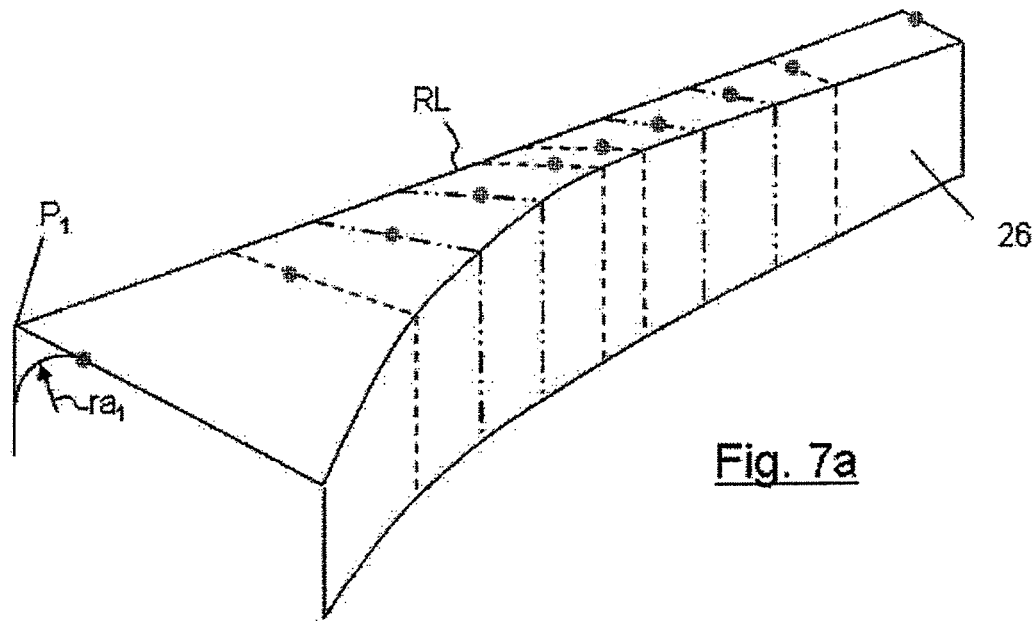
Figure 7B:
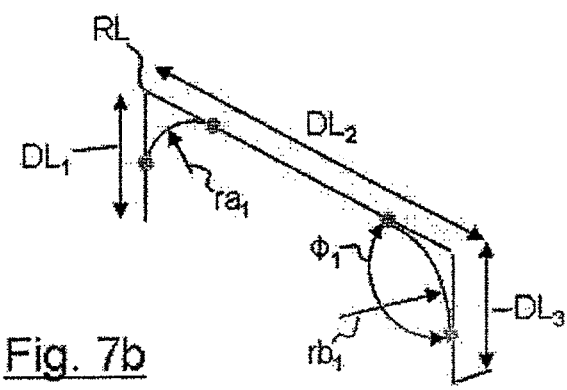

With reference to FIGS. 7a and 7b corner/fillet radii are added at each of the positions P1 to P10 at both the upper flange edge (coincident with reference line RL) and the lower flange edge 26. The size of the corner/fillet radii are determined in dependence on the developed width. The developed width is calculated at this stage by determining the distances $DL_1$, $DL_2$ and $DL_3$ (see FIG. 7b), the developed width of the spar model (without radii) being equal to the sum of the measured distances $DL_1$, $DL_2$ and $DL_3$. As can be seen from FIG. 7b, the distance $DL_1$ is the height of the upper flange line, the distance $DL_2$ is the width of the revised web shape 8' and the distance $DL_3$ is the height of the lower flange line. The angle θ between the revised web surface 8' and the lower flange surface 18' is determined for the cross-section of each position P1 to P10 (see FIG. 7b). The radius $ra_1$ at the first position P1 is then set for the upper flange edge and similarly (shown only in FIG. 7b) the radius $rb_1$, at the lower flange edge at the same cross-sectional position is set.

The radii $ra_1$–$ra_n$, $rb_1$–$rb_{10}$ at the upper and lower flange edges are set so as to further reduce the deviation of the relationship between the developed width DW of the spar and the distance along the length of the spar from a linear relationship.

Figure 8:
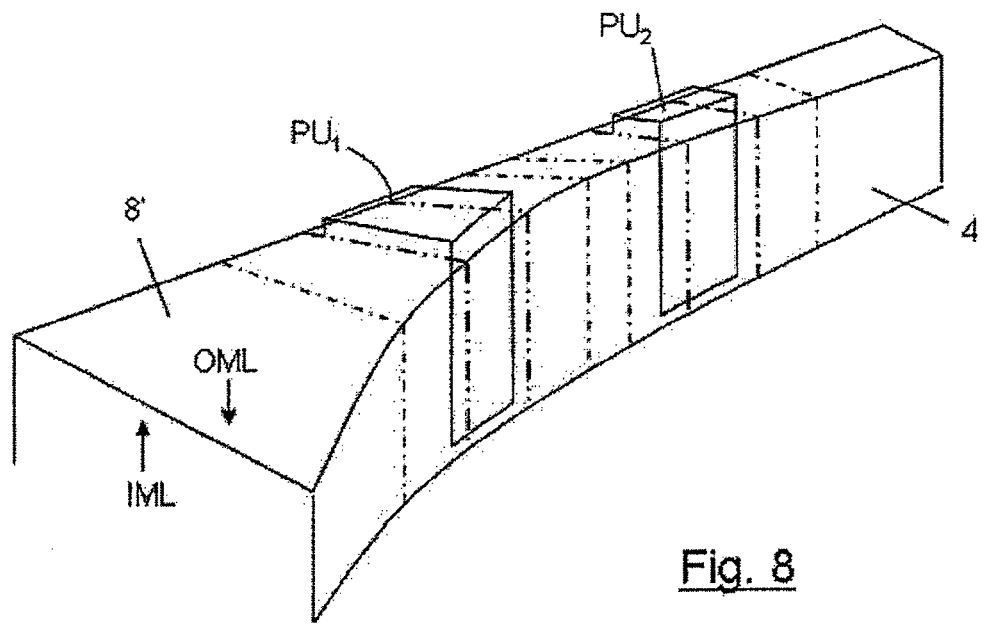

With reference to FIG. 8, the pad-up/thickness change surfaces $PU_1$, $PU_2$ are then added to the model, by joggling the flanged surfaces inwards in the direction from the OML surface to the IML surface and consequently joggling the revised web surface 8' outwards in a direction from the IML to the OML. By joggling the web surface 8' to match the joggle in the flange surfaces, the developed width of the spar at any given point along the length of the spar is not significantly altered.

Figure 9:
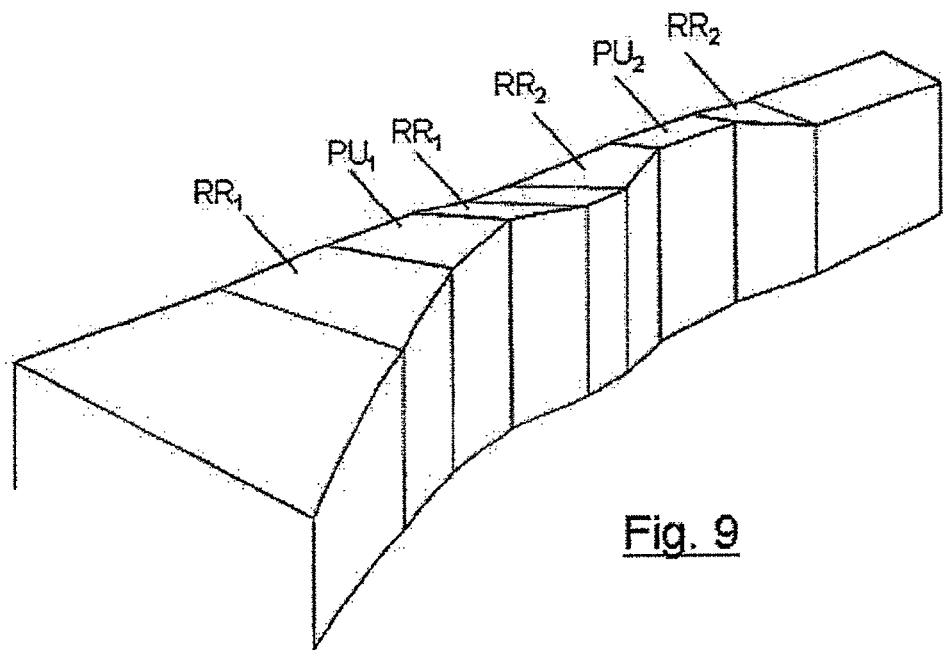

The ramp surfaces $RR_1$, $RR_2$ are then created so as to join the pad-up/thickness change surfaces $PU_1$, $PU_2$ as shown in FIG. 9. Thus there are ramping regions $RR_1$ either side of the first pad-up region $PU_1$ and ramping regions $RR_2$ are either side of a second pad-up region $PU_2$.

Figure 10A:
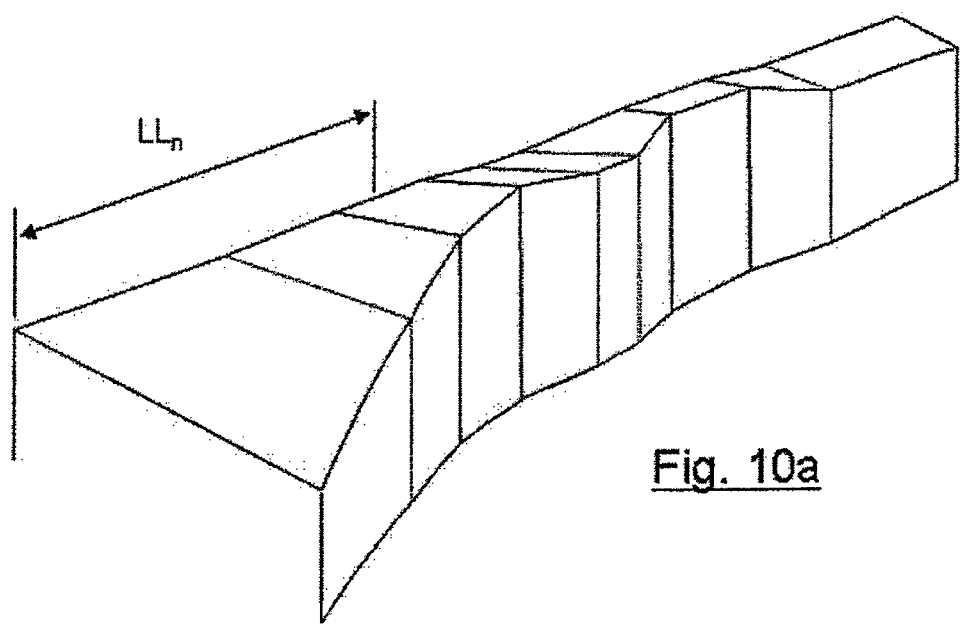
Figure 10B:
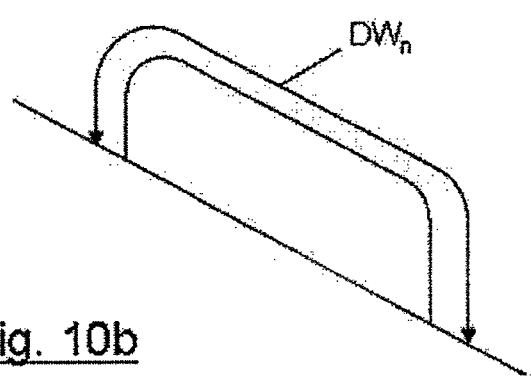

With references to FIGS. 10a and 10b, the developed width $DW_n$ at successive positions $P_n$ along the length of the spar are calculated and the radii $ra_1$–$ra_{10}$, $rb_1$–$rb_{10}$ are varied to ensure that the developed width increases linearly with length $LL_n$ along the spar. The desired developed width $DW_n$ at a position $P_n$ can be calculated by means of the following formula:

$$DW_n = DW_1 + K\,LL_n$$

where $DW_n$ is the developed width at position $P_1$, K is a equal to $(DW_{end} - DW_1)/$(length of spar) and $LL_n$ is the linear separation in a direction parallel to the length of the spar of position $P_n$ from position $P_1$. The radii $ra_n$ and $rb_n$ to provide such a linearly varying developed width can be calculated by means of satisfying the following formula:

$$DW_n = DL_n - ra_n\left(\theta_n + \frac{2}{\tan\frac{\theta_n}{2}} - \pi\right) - rb_n\left(\phi_n + \frac{2}{\tan\frac{\phi_n}{2}} - \pi\right)$$

where $DL_n$=developed width of the spar at position $P_n$ with no radii (equal to $DL_1 + DL_2 + DL_3$—see FIG. 7b). As $DW_n$, $DL_n$, $θ_n$ and $Φ_n$ are known and/or can be calculated, there is a certain amount of flexibility in setting the values $ra_n$ and $rb_n$. For example $ra_n$ and $rb_n$ may be equal or one may be required to be a fixed percentage greater than the other.

The resulting geometrical shape is then reviewed to ensure that the surface is such that it does not require layers of composite material to adapt radii tighter than physically possible, which may require blending/smoothing of surfaces and recalculation of radii values to ensure that the developed width remains linearly changing. This last stage of the process may be repetitive and may require several recalculations and adjustments before a suitable geometry is arrived at. The geometry of the spar is then used to produce mould tools, with which a composite spar may be fabricated in accordance with techniques that are standard in the art.

Figure 11A:
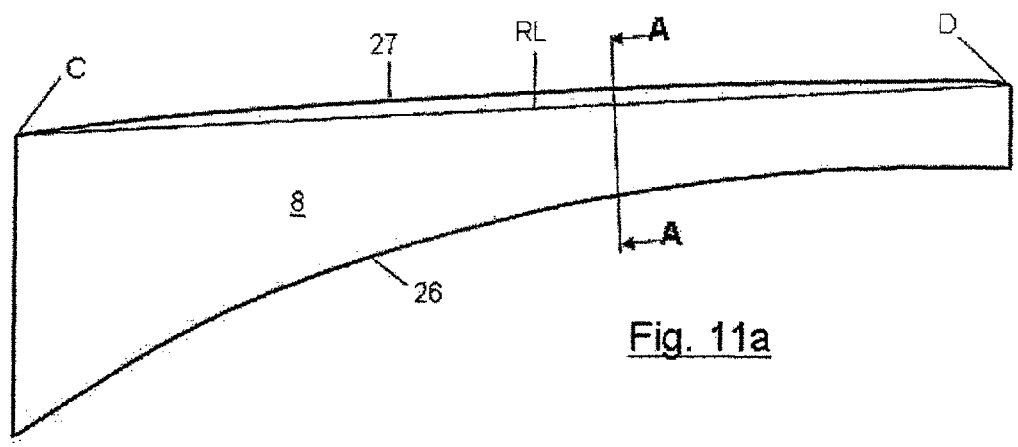
Figure 11B:

FIGS. 11a and 11b show a composite spar shape having an upper flange surface 27 with curvature. If the method of the first embodiment were to be applied to a spar having such a shape certain adjustments may need to be made. In this case, the reference line RL may be defined as the straight line between the extreme ends of the curve C, D. If the curvature on the upper surface 27 is significant then it may be necessary to move the reference line RL from being coincident with the extreme ends of the curve towards the lower flange surface, maintaining the same aspect. Thus for the cross-section A-A as shown in FIG. 11b (showing the upper flange 4 to the right and the lower flange 6 to the left), the reference line RL may be significantly separated from the upper flange edge 27. The reference line RL could alternatively be defined by means of a line that is not parallel to the upper flange edge; what is important (at least in this embodiment of the invention) is that the same reference line is used as a fixed line to which all subsequent geometrical manipulations made may depend on or refer to.

Figure 12:
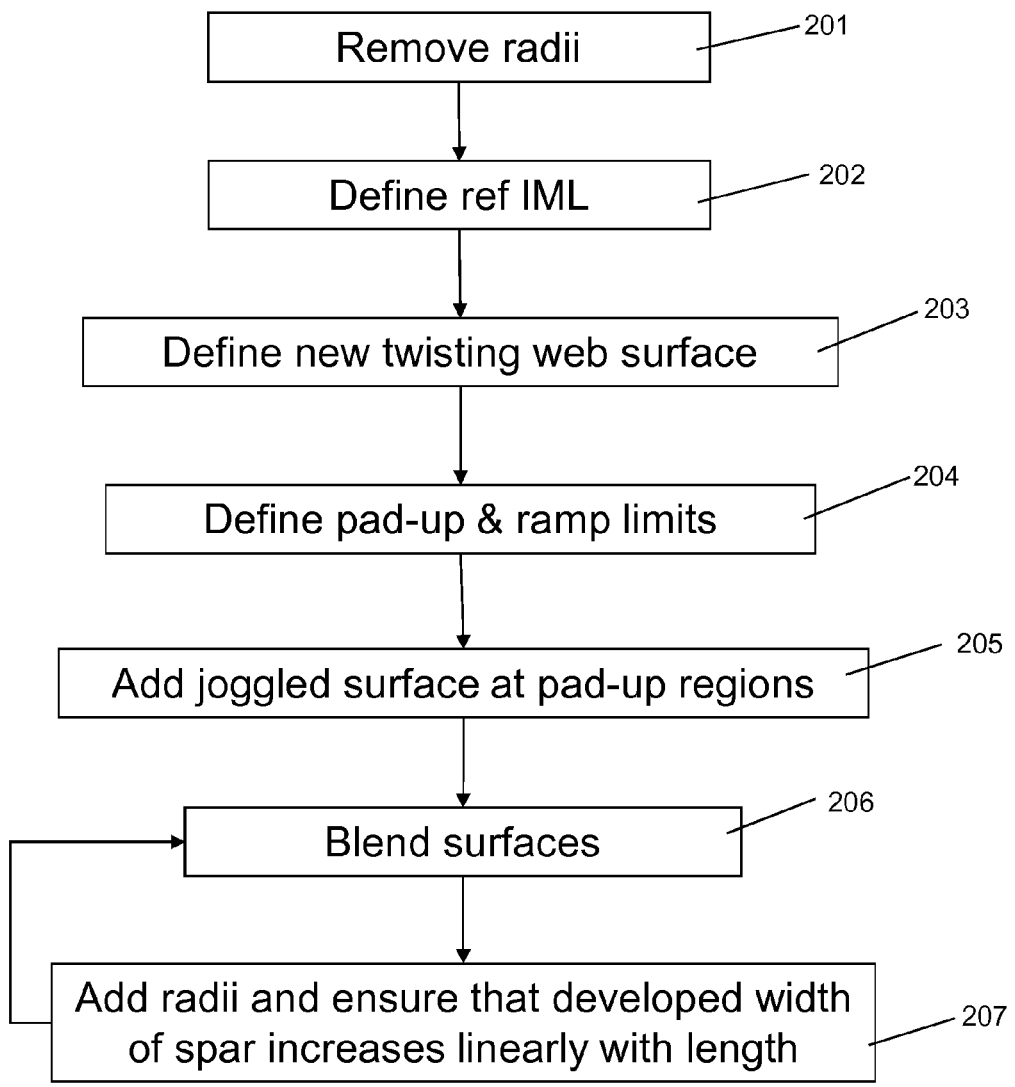
FIG. 12 illustrates a method of designing a spar in accordance with a second embodiment of the present invention.

FIG. 12 illustrates a flow chart in accordance with a method of designing a structural member for use in an aerospace structure according to a second embodiment. The method is similar to the method of the first embodiment of the invention. As a first step 201 the nominal reference shape of the composite spar to be manufactured is derived by generating a spar shape in accordance with the desired wing geometry, but ignoring factors associated with the spar being made from composite material. Typically, such a spar will have planer regions and curved regions. During the first step 201 such curved regions are removed and replaced with well defined edges between planer surfaces. Thus, the outer mould surface is defined.

As the second step 202 the inner mould line is generated by offsetting from the outer mould line the minimum required thickness of the spar structure. As the next step, the third step 203, a twisting web surface is defined by lengthening one or other of the upper and lower flanges of the structure, thereby introducing a twist in the web between the upper and lower flange edges. The web is therefore no longer perpendicular to the flanges along the entire length of the member. The degree of twisting is greater where the deviation from a strictly linearly changing developed width is greatest.

As a fourth step 204, the thickness changes in wing skin, requiring pad-ups or pad-downs on the upper and lower flange surfaces are added and consequently corresponding pad-up/pad-down surfaces are added to the web surface as the fifth step 205. Ramp limits are also set so that the pad-up regions are reached gradually. By adding joggles to the web in correspondence with the joggles in the flanges, the deviation from a linearly changing developed width of spar may be reduced. The surfaces so generated by the first to fifth steps 201 to 205 are then blended, by morphing the surfaces, thereby producing a smoothly changing surface (sixth step 206). The desired developed width is then calculated for a multiplicity of positions along the length of the spar, the separation of the positions being sufficiently small to ensure that the resulting model has a geometry sufficiently close to the desired linearly changing developed width geometry that no defects are caused by laying up material during manufacture (i.e. substantially eliminating the risk of creases being introduced by bunching or stretching of fibres in the composite material layers). Fillet radii are then calculated, as a seventh step 207, and inserted at the web flange junctions. The regions between the multiplicity of positions are redefined by means of morphing/interpolation, by means of repeating the sixth step. As a final check the change in developed width along the spar is ascertained and any deviations from a substantially linearly changing relationship are calculated. If the deviations are such that there is a risk of defects then the radii are adjusted again by means of repeating the sixth and seventh steps 206 and 207 until there is no deviation. It is however expected that there will be no need to repeat step 207. It will be noted, in contrast to the first embodiment, that fillet/corner radii are inserted into the model after the pad-ups and ramping regions have been inserted.

FIGS. 13a to 13d illustrate schematically a spar accordingly to a third-embodiment of the present invention. The spar 102 is made from layers of fibre material embedded in a resin matrix, the outer layer of which being shown in FIG. 13a in schematic form. Whilst there are well defined edges and boundaries in the layer shown in FIG. 13a it will be appreciated that it is not easy to form such sharp edges by means of layers of composite material. In reality there would typically be no sharp edges to the shape of the spar and instead there are smooth radii between transitions of one gradient and a different gradient. The layer shown in FIG. 13a has a first surface 110 being shaped to abut a wing panel and a second surface (not shown in FIG. 13a) opposite the first surface and being on the same (lower) flange 106. The spar also includes a web 108 which extends from the lower flange 106. On the web 108 there is defined a third surface 114 which is at the same layer in the composite material as the first surface 110. There is also a fourth surface on the web on the opposite side of the third surface 114, the fourth surface being on the same side of the spar as the second surface (the second and fourth surfaces not being shown in FIG. 13a).

The cross-sectional geometry of the spar 102 varies along its length. In particular, the geometry of the lower flange 106 has a varying geometry to accommodate pad-up and thickness changes in the wing panel against which it is to abut (the wing panel not being shown in FIG. 13a). The cross-sectional geometry of the web 108 also varies along the length of the spar 102, the variation in geometry of the web 108 depending on the variation in geometry of the lower flange 106. In particular, the developed width of the spar increases linearly with increasing length L. The developed width in this embodiment is measured as being the geodesic distance between the distal edge 106e of the lower flange 106 to the distal edge 104e of the upper flange 104.

It will, of course, be appreciated that the edges 104e, 106e of the upper and lower flanges 104, 106 need not lie on geodesic lines. There may for example be cut-outs in the upper or lower flanges 104, 106 in the region of their edges 104e, 106e which would cause the developed width in such regions to change with length in a non-linear relationship. Such cut-outs would not, however, detract from the benefit of the present invention whereby causing the developed width to increase (in regions without such cut-outs) in a linear relationship with distance along the length of the spar reduces the risk of bunching of fibres and/or creasing of the composite layers, with a consequent reduction in the risk of defects being formed in the composite spar 102. FIGS. 13a to 13d show that the geodesic distance between first and second geodesic reference lines on the lower flange 106 and web 108 respectively also varies linearly with distance along the length of the spar. Thus, a first geodesic line 150 is defined on the first surface 110 (on the lower flange 106) and extends along the entire length of the spar 102 and a second geodesic line 152 is defined on the third surface 114 (on the web 108) also extending the entire length of the spar 102. (The skilled person will, of course, appreciate that the word "geodesic line" is used herein to mean a line that represents the shortest distance possible between two points on a surface when the geometry of the line is restricted within the two dimensions of that surface and that the term "geodesic distances" is used in a similar manner).

The first geodesic line 150 may be drawn so that it is contained within a plane (for example, a plane parallel to the plane represented by the plane 154 in FIG. 13a). However, as a result of the twisting nature of the web 108 and as a result of the non-parallel nature of the boundaries between the changing gradients on the web 108, it may not be possible to draw a geodesic line on the web 108 that may be contained within a single plane.

FIGS. 13b to 13d represent cross-sections taken at successive positions along the length of the spar 102. Thus, FIG. 13b illustrates schematically the geodesic distance 158 between the first and second reference lines 150, 152 at a first position along the length of the spar. FIGS. 13c and 13d shows the geodesic distances 160 and 162 at two further cross-sections at points further along the length L of the spar 102. As can readily be seen the geodesic distance gets progressively smaller with increased length L along the spar direction represented by the arrow 164. It will also be noted with reference to FIGS. 13b, 13c and 13d that with increasing distance along the length (in direction represented by the arrow 164) the web of the spar 102 initially twists in an anticlockwise direction. Thus, in the cross-section represented by FIG. 13b, the web 108 is generally perpendicular to the upper flange 104. However, further along the length of the spar at the cross section represented FIG. 13c the angle θ between the upper flange 104 and the web 108 has increased to an angle of greater than 90 degrees. Moving from the cross-section represented by FIG. 13c further down the length L of the spar 102 the web 108 then twists back to a geometry in which it is again approximately perpendicular to the upper flange 104 as can be seen in the cross-section represented by FIG. 13d. Thus, with reference to FIG. 13a, as one moves from the root end of the spar (the left hand side of FIG. 13a) the third surface 114 initially twists about an axis (parallel to the arrow 164) in an anticlockwise direction for a first portion of the spar. As one moves from this first portion towards the wing tip end of the spar 102, the third surface 114 then twists about the same axis in the clockwise direction for a second portion. Incorporating such a twist in the web effectively allows the height (shown in the dimension in the direction represented by the arrow 166 in FIG. 13a) of the flanges 104, 106 to be varied thereby providing a means by which the developed width $DW_n$ of the spar may be controlled. Controlling the developed width of the spar 102 by introducing such a twisted web 108 provides a designer of such spar with a means of varying the developed width to a much greater extent than joggling or introducing fillets/radii could. Inserting joggles in the shape of the spar and/or inserting fillets and/or radii in the manner described above can also, of course, provide extra control over the developed width of the spar with increasing length, but may in certain embodiments of the invention prove unnecessary.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The insertion of a spline line in the first embodiment described above is achieved by means of joining a multiplicity of offset points, each of which being generated inserting a point separated from a flange edge of the spar in a direction normal to the web. A spline line could be inserted in a different manner, for example, by offsetting points in a direction that is not normal to the web. It might then be possible to generate a spar geometry in which the curved surfaces joining the web and flanges of the spar all have a constant radius of curvature, the developed width of the spar being controlled by means of changing the dimensions of the web and flanges and/or by means of changing the angles of inclination between the web and the flanges.

The above embodiments concern the shape and geometry of a spar for supporting a wing panel. It will of course be appreciated that the principles of the above-described embodiments of the invention could be applied to other parts of the structure of an aircraft where there is a panel or portion of skin of the aircraft that is supported or stiffened by means of an elongate structural member. Thus, applications for embodiments of this invention could be widespread within the aerospace sector and include any instance where a composite spar, rib, stringer or other elongate structural member is required on a varying thickness panel.

It is within the scope of the present invention for sections of the spar to be in accordance with one or more of the above-mentioned embodiments, and other sections of the spar not to be in accordance with any of the above embodiments.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims.

The invention claimed is:

1. An elongate structural member for use in an aerospace structure, wherein
   the structural member is made from composite material comprising a multiplicity of layers,
   the structural member has a foot and a web extending from the foot,
   the structural member defines
      a first surface on the foot being shaped to abut the aerospace structure,
      a second surface on the foot being opposite the first surface,
      a third surface on or in the web being at the same layer in the composite material as the first surface, and
      a fourth surface on the web being on the same side of the structural member as the second surface,
   the cross-sectional geometry of the structural member varies along at least part of its length so that the geodesic distance between first and second notional reference lines increases across substantially the entire length of the structural member and increases substantially linearly as a function of lengthwise distance along said at least part of the length of the structural member, the first and second notional reference lines each being geodesic lines, which extend across the entire length of said at least part of the length of the structural member, the first notional line lying on the first surface and the second notional line lying on the third surface, and the geodesic distance being measured along the first and third surfaces of the structural member,
   whereby the risk of causing, during fabrication of the elongate structural member, undesirable creasing, stressing or stretching of composite material layers in a region in which the geometry of the elongate structural member varies with increasing distance along its length is reduced.

2. An elongate structural member according to claim 1, wherein the angle at which the web extends from the foot varies as a function of the distance along the length of the structural member.

3. An elongate structural member according to claim 2, wherein the third surface includes a twist about an axis generally aligned with the length of the structural member.

4. An elongate structural member according to claim 2, wherein the third surface includes a clockwise twist about an axis generally aligned with the length of the structural member and an anti-clockwise twist about the same axis at a different position along the length of the member.

5. An elongate structural member according to claim 2, wherein the web twists as a function of distance along the length of the member, the twisting being predominantly in one direction for a first portion along the length of the structural member and predominantly in the opposite direction for a second portion along the length of the structural member.

6. An elongate structural member for use in an aerospace structure, wherein
   the structural member is made from composite material comprising a multiplicity of layers,
   the structural member has a foot and a web extending from the foot,
   the structural member defines
      a first surface on the foot being shaped to abut the aerospace structure,
      a second surface on the foot being opposite the first surface, a third surface on or in the web being at the same layer in the composite material as the first surface, and a fourth surface on the web being on the same side of the structural member as the second surface, the cross-sectional geometry of the structural member varies along at least part of its length so that with increasing distance in a given direction along the length of the structural member the third surface twists about an axis being generally aligned with the length of the structural member, the twisting of the third surface being predominantly in one direction for a first portion along the length of the structural member and being predominantly in the opposite direction for a second portion along the length of the structural member, whereby the risk of causing, during fabrication of the elongate structural member, undesirable creasing, stressing or stretching of composite material layers in a region in which the geometry of the elongate structural member varies with increasing distance along its length is reduced.

7. An elongate structural member according to claim 1, wherein the cross-sectional geometry varies non-linearly along said at least part of its length.

8. An elongate structural member according to claim 1, wherein the member is in the form of a spar.

9. An elongate structural member according to claim 1, wherein the member has a cross-sectional shape which is generally U-shaped.

10. An elongate structural member according to claim 1, wherein the member has a second foot, the web of the member extending between its two feet.

11. An aerospace structure, an outer surface of which being defined by a skin, wherein an inner surface of the skin abuts a foot of an elongate structural member being in accordance with a structural member according to claim 1.

12. An aircraft, an outer surface of which being defined by a skin, wherein an inner surface of the skin abuts a foot of an elongate structural member being in accordance with a structural member according to claim 1.

13. An elongate structural member according to claim 10, wherein the elongate structural member is in the form of a composite spar for an aircraft wing, the spar having upper and lower flanges, one of the upper and lower flanges being defined by said second foot and the other of the upper and lower flanges being defined by the other foot, a single layer of composite material extends, between a pair of opposite edges of the layer, from the upper flange via the web to the lower flange, the cross-sectional geometry of the spar varies with distance along the length of the spar in the region of the single layer, and the widthwise geodesic distance as measured along the single layer between the pair of opposite edges increases substantially linearly as a function of distance along the length of the layer.

14. An aerospace structure, an outer surface of which being defined by a skin, wherein an inner surface of the skin abuts a flange of a spar being in accordance with an elongate structural member according to claim 13.

15. An aircraft, an outer surface of which being defined by a skin, wherein an inner surface of the skin abuts a flange of a spar being in accordance with an elongate structural member according to claim 13.

* * * * *